United States Patent
Oomori et al.

(10) Patent No.: US 6,630,282 B2
(45) Date of Patent: Oct. 7, 2003

(54) CROSSLINKED POSITIVE-WORKING PHOTORESIST COMPOSITION

(75) Inventors: Katsumi Oomori, Chigasaki (JP); Yohei Kinoshita, Sagamihara (JP); Tomotaka Yamada, Atsugi (JP); Toshikazu Takayama, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 256 days.

(21) Appl. No.: 09/928,399

(22) Filed: Aug. 14, 2001

(65) Prior Publication Data

US 2002/0034704 A1 Mar. 21, 2002

(30) Foreign Application Priority Data

Aug. 21, 2000 (JP) ........................................ 2000-250174
Aug. 21, 2000 (JP) ........................................ 2000-250175

(51) Int. Cl.$^7$ .............................................. G03F 7/038
(52) U.S. Cl. .................................... 430/270.1; 430/311
(58) Field of Search ............................... 430/270.1, 311

(56) References Cited

U.S. PATENT DOCUMENTS

| | | | |
|---|---|---|---|
| 5,849,808 A | 12/1998 | Schacht et al. | |
| 5,939,235 A | 8/1999 | Kondo et al. | |
| 5,994,022 A | 11/1999 | Tanabe et al. | |
| 6,156,481 A | 12/2000 | Takeda et al. | |
| 2002/0045133 A1 * | 4/2002 | Maemori et al. | 430/311 |

FOREIGN PATENT DOCUMENTS

| | | |
|---|---|---|
| EP | 0 422 628 | 4/1991 |
| EP | 0 901 043 | 3/1999 |
| EP | 0 930 541 | 7/1999 |
| EP | 1 011 029 | 6/2000 |
| JP | 6-148889 | 5/1994 |
| JP | 8-62844 | 3/1996 |
| JP | 2000-214587 | 8/2000 |
| JP | 2000-347405 | 12/2000 |
| JP | 2001-166478 * 6/2001 ........... G03F/7/039 |

OTHER PUBLICATIONS

Machine translation of JP 2001–166478.*

* cited by examiner

*Primary Examiner*—Janet Baxter
*Assistant Examiner*—Amanda C. Walke
(74) *Attorney, Agent, or Firm*—Wenderoth, Lind & Ponack L.L.P.

(57) ABSTRACT

The invention discloses a chemical-amplification positive-working photoresist composition of the crosslinked type used for photolithographic patterning works in the manufacture of electronic devices. While the composition comprises a film-forming resinous ingredient capable of being imparted with increased alkali-solubility in the presence of an acid and a radiation-sensitive acid-generating compound, optionally, with further admixture of an aliphatic amine compound and an acid compound, the inventive photoresist composition is characterized by the unique resinous ingredient which consists of four types of monomeric units including hydroxystyrene units, styrene units, monomeric units having acid-dissociable solubility-reducing groups and crosslinking units. The acid-dissociable solubility-reducing group is not conventional tert-butoxycarbonyloxy group but characteristically a 1-alkylcyclohexyl group or a polycyclic saturated aliphatic hydrocarbon group.

14 Claims, No Drawings

CROSSLINKED POSITIVE-WORKING PHOTORESIST COMPOSITION

BACKGROUND OF THE INVENTION

The present invention relates to a positive-working photoresist composition used for patterning in the manufacture of fine electronic devices or, more particularly, to a crosslinked positive-working photoresist composition of the chemical-amplification type capable of giving a patterned resist layer with high pattern resolution and excellent resistance against etching.

In recent years, chemical-amplification positive-working photoresist compositions are widely employed in the photolithographic patterning process in the mass production of certain fine electronic devices which require extremely fine patterning of the resist layer because pattern resolution with fineness of 0.15 to 0.22 μm can be accomplished with a photoresist composition of this type when used in combination with an underlying appropriate anti-reflection coating film.

On the other hand, the demand for finer and finer patterning of the resist layer is increasing year by year in the manufacture of semiconductor devices and an innovative process of next generation is now under way of development for accomplishing patterning fineness of 0.12 to 0.15 μm which is possible only by the use of an exposure light source of a very short wavelength such as KrF and ArF excimer laser beams. While the film thickness of the photoresist layer is a factor limiting fineness of pattern resolution and a thickness not exceeding 0.6 μm is desired for the above-mentioned fineness of resolution, a problem which must be solved with a photoresist layer of such a small thickness is the low resistance of the patterned resist layer therefrom against etching involved in the semiconductor processing.

Crosslinked chemical-amplification positive-working photoresist compositions are known as disclosed in Japanese Patent Kokai 6-148889 and 8-305025, in which the base resinous ingredient is a polymer containing monomeric units derived from a hydroxystyrene and crosslinks are formed between the molecules of the base resin by bridging the hydroxyl groups of the hydroxystyrene units with crosslinking units of divinyl ether and the like. The crosslinked chemical-amplification positive-working photoresist compositions, however, cannot fully comply with the technological requirement for high pattern resolution and etching resistance when the thickness of the resist layer is so small as mentioned above even though the requirement for improved etching resistance can be satisfied therewith.

SUMMARY OF THE INVENTION

The present invention accordingly has an object, in view of the above described problems and disadvantages in the prior art, to provide a novel and improved crosslinked chemical-amplification positive-working photoresist composition capable of giving a patterned resist layer of high pattern resolution and highly resistant against etching even when the thickness of the photoresist layer is so small as to be able to comply with the requirement in recent years.

Thus, the crosslinked positive-working photoresist composition is a uniform blend as dissolved in an organic solvent which comprises, according to the first aspect of the invention:

(a1) a polymeric resin which is subject to an increase of the solubility in an aqueous alkaline solution in the presence of an acid; and (b) a radiation-sensitive acid-generating agent capable of releasing an acid when irradiated with a radiation, in which the polymeric resin as the component (a1) is a quaternary copolymer consisting of four kinds of monomeric units including (a11) monomeric units of the first type represented by the general formula

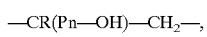

in which R is a hydrogen atom or a methyl group and Pn is a phenylene group, (a12) monomeric units of the second type represented by the general formula

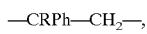

in which R is a hydrogen atom or a methyl group and Ph is a phenyl group, (a13) monomeric units of the third type represented by the general formula

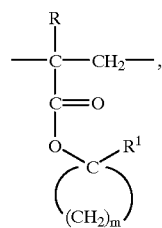

(I)

in which R is a hydrogen atom or a methyl group, $R^1$ is an alkyl group having 1 to 4 carbon atoms and the subscript m is a positive integer of 3 to 7, and (a14) monomeric units of the fourth type represented by the general formula

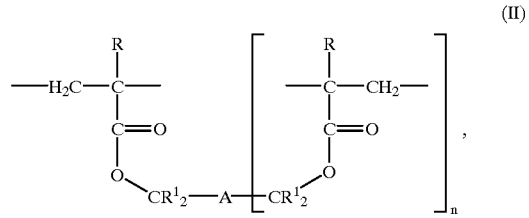

(II)

in which R is a hydrogen atom or a methyl group, each $R^1$ is, independently from the others, an alkyl group having 1 to 4 carbon atoms, the subscript n is 1, 2 or 3 and A is a single bond or an organic group of (n+1) valency.

Further, the crosslinked positive-working photoresist composition is a uniform blend as dissolved in an organic solvent which comprises, according to the second aspect of the invention:

(a2) a polymeric resin which is subject to an increase of the solubility in an aqueous alkaline solution in the presence of an acid; and (b) a radiation-sensitive acid-generating agent capable of releasing an acid when irradiated with a radiation, in which the polymeric resin as the component (a2) is a quaternary copolymer consisting of four kinds of monomeric units including (a21) monomeric units of the first type represented by the general formula

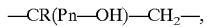

in which R is a hydrogen atom or a methyl group and Pn is a phenylene group, (a22) monomeric units of the second type represented by the general formula

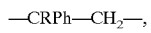

in which R is a hydrogen atom or a methyl group and Ph is a phenyl group, (a23) monomeric units of the third type represented by the general formula

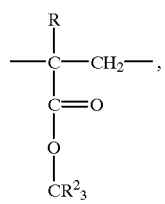

(III)

in which R is a hydrogen atom or a methyl group, $R^2{}_3$ jointly denoting three $R^2$ groups represents a combination of one saturated polycyclic hydrocarbon group and two alkyl groups each having 1 to 4 carbon atoms or a combination of an alkyl group having 1 to 4 carbon atoms as one of the three $R^2$ groups and a saturated polycyclic hydrocarbon group formed jointly from two divalent hydrocarbon groups as the rest of the three $R^2$ groups together with the carbon atom adjacent to the ester linkage, and (a24) monomeric units of the fourth type represented by the general formula

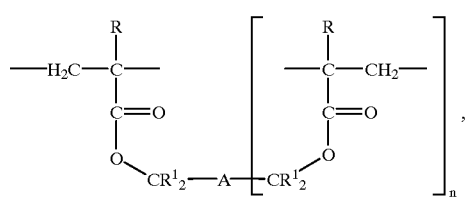

(II)

in which R is a hydrogen atom or a methyl group, each $R^1$ is, independently from the others, an alkyl group having 1 to 4 carbon atoms, the subscript n is 1, 2 or 3 and A is a single bond or an organic group of (n+1) valency.

DETAILED DESCRIPTION OF THE PREFERRED EMBODIMENTS

As is understood from the above given description, the photoresist compositions of the invention according to the first and second aspects of the invention are each characterized in that the resinous component (a1) or (a2), which is imparted with increased solubility in an aqueous alkaline solution in the presence of an acid, is a quaternary copolymer consisting of four kinds of the monomeric units (a11) to (a14) or (a21) to (a24).

In the following, detailed descriptions are given of the inventive photoresist compositions first according to the first aspect of the invention and then according to the second aspect of the invention.

The monomeric unit of the first type, i.e. (a11), constituting the resinous component (a1) is represented by the general formula —CR(Pn—OH)—CH$_2$—, in which R is a hydrogen atom or a methyl group and Pn is a phenylene group including 1,2-, 1,3- and 1,4-phenylene groups. These monomeric units can be introduced by using a hydroxystyrene or a-methyl hydroxystyrene as one of the comonomers from which the quaternary copolymeric resin (a1) is prepared by copolymerization. The monomeric units of this type contribute to the alkali-solubility and etching resistance of the copolymeric resin.

The monomeric units of the second type, i.e. (a12), are represented by the general formula —CRPh—CH$_2$—, in which R has the same meaning as defined above and Ph is a phenyl group. These monomeric units (a12) can be introduced by the use of styrene or α-methylstyrene as one of the comonomers from which the resinous component (a1) is prepared by copolymerization. These monomeric units (a12) contribute to the alkali-insolubility and etching resistance of the copolymeric resin (a1).

The monomeric units of the third type, i.e. (a13), are represented by the general formula (I) given above and are the units having acid-dissociable solubility-reducing groups. When the photoresist composition is exposed to light, namely, an acid is released from the acid-generating agent as the component (b) and the acid causes dissociation of the cyclic tertiary alkyl group bonded to the monomeric unit through the ester linkage so that the alkali-insoluble resin (a1) is imparted with increased solubility in an aqueous alkaline solution as a result of conversion of the ester linkages into carboxyl groups. Since the tertiary alkyl group forming the esteric structure is a monocycloalkyl group, such as cyclobutyl, cyclopentyl, cyclohexyl, cycloheptyl and cyclooctyl groups, the photoresist composition formulated with the resin (a1) is advantageous in respect of high etching resistance and high pattern resolution as compared with conventional linear or branched tertiary alkyl groups such as tert-butyl group. Cyclopentyl and cyclohexyl groups are preferred as the tertiary cycloalkyl group because of the particularly high pattern resolution and large focusing depth latitude. The group denoted by $R^1$ in the general formula (I) is an alkyl group having 1 to 5 carbon atoms, of which ethyl, propyl and butyl groups are preferred.

The monomeric units of the fourth type, i.e. (a14), are represented by the general formula (II). This unit is a crosslinking unit in which at least two units or, generally, (n+1) units derived from a tertiary alkyl (meth)acrylate are bonded to the tertiary carbon atoms either directly or through an organic group A of (n+1) valency. Similarly to the monomeric units (a13), the ester linkages in these units are susceptible to dissociation by the action of an acid released from the acid-generating agent as the component (b) and the ester linkages are converted into carboxyl groups so that the photoresist layer in the light-exposed areas is imparted with increased alkali solubility while the layer in the unexposed areas remains alkali-insoluble contributing to improvements in the contrast of patterning and etching resistance of the patterned resist layer.

The group denoted by $R^1$ in the general formula (II) is a lower alkyl group such as methyl, ethyl, n-propyl, isopropyl, n-butyl, isobutyl, tert-butyl and n-pentyl groups of which those having 1 to 5 carbon atoms or, in particular, 1 to 4 carbon atoms are preferred.

In the general formula (II), A represents a single bond or an organic group of (n+1) valency, in which n is 1, 2 or 3. When A is an organic group of (n+1) valency, the group is preferably a hydrocarbon residue having up to 20 carbon atoms. The hydrocarbon residue of which n is 1 is exemplified by straightly linear or branched alkylene groups, cycloalkylene groups and arylene groups. The hydrocarbon residue of which n is 2 is exemplified by those tervalent groups derived from the above-mentioned divalent hydrocarbon groups by further eliminating a hydrogen atom while the hydrocarbon residue of which n is 3 is exemplified by those tetravalent groups derived from the above named divalent hydrocarbon groups by eliminating further two hydrogen atoms. A preferable resinous component (a1) in the inventive photoresist composition is that in which A in the crosslinking unit (a14) is a straightly linear alkylene group having 1 to 10 carbon atoms and the groups $R^1$ are each a methyl group.

The above described crosslinking units (a14) can be derived from a di-, tri- or tetraester compound having 2 to 4 ethylenically unsaturated linkages as an esterification product between one mole of a diol, triol or tetrol compound having hydroxyl-bonding tertiary carbon atoms at the respective molecular terminals and 2 to 4 moles of (meth) acrylic acid or a reactive functional derivative thereof such as acid halides.

The above-mentioned diol compound is exemplified by glycol compounds such as 2,3-dimethyl-2,3-butanediol, 2,3-diethyl-2,3-butanediol, 2,3-di-n-propyl-2,3-butanediol, 2,4-dimethyl-2,4-pentanediol, 2,4-diethyl-2,4-pentanediol, 2,4-di-n-propyl-2,4-pentanediol, 2,5-dimethyl-2,5-hexanediol, 2,5-diethyl-2,5-hexanediol, 2,5-di-n-propyl-2,5-hexanediol, 2,6-dimethyl-2,6-heptanediol, 2,6-diethyl-2,6-heptanediol and 2,6-di-n-propyl-2,6-heptanediol. The triol compound is exemplified by 2,4-dimethyl-2,4-dihydroxy-3-(2-hydroxypropyl)-pentane, 2,4-diethyl-2,4-dihydroxy-3-(2-hydroxypropyl)pentane, 2,5-dimethyl-2,5-dihydroxy-3-(2-hydroxypropyl)hexane and 2,5-diethyl-2,5-dihydroxy-3-(2-hydroxypropyl)hexane. The tetrol compound is exemplified by erythritol, pentaerythritol and 2,3,4,5-hexane tetrol.

A particularly preferable diester compound is that represented by the following structural formula

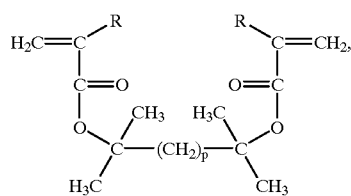

in which R is a hydrogen atom or methyl group and the subscript p is 0, 1 or 2. Particularly preferable triester compounds include those expressed by the structural formulas

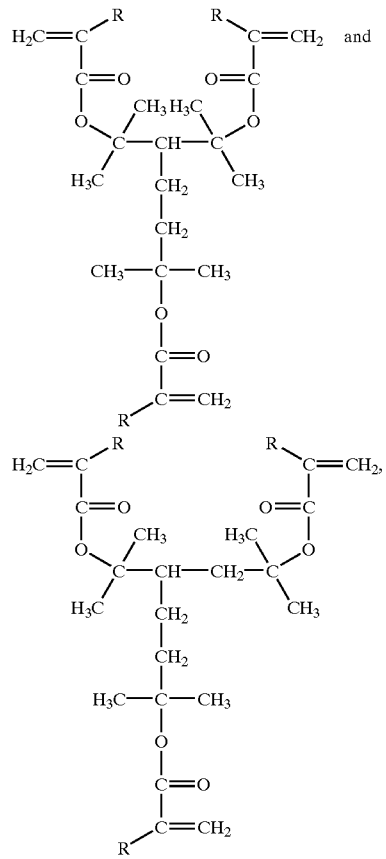

in which R has the same meaning as defined above.

In the photoresist composition of the present invention, the solubility behavior of the resinous component (a1) in an aqueous alkaline solution is the key factor influencing the quality of the patterned resist layer such as the pattern resolution and cross sectional profile of the patterned resist layer. For example, the film thickness reduction of a film of the component (a1) in a 2.38% aqueous solution of tetramethyl-ammonium hydroxide at 23° C. should desirably be in the range from 5 to 500 nm/second or, preferably, in the range from 10 to 300 nm/second.

The above-mentioned characteristics of the copolymeric resinous component (a1) can be controlled by adequately selecting the molar fractions of the monomeric units and crosslinking units (a11) to (a14). For example, the molar fraction of the units (a11) should be in the range from 50 to 80% or, preferably, from 65 to 80%. The molar fraction of the units (a12) should be in the range from 1 to 25% or, preferably, from 5 to 20%. The molar fraction of the units (a13) should be in the range from 3 to 25% or, preferably, from 5 to 20%. The molar fraction of the units (a14) should be in the range from 1 to 15% or, preferably, from 3 to 10%. Besides the above-mentioned four types of the units (a11) to (a14), it is optional that the resinous component (a1) further comprises different monomeric units such as the units derived from a (meth)acrylic acid derivative heretofore included in the resinous ingredient of conventional positive-working photoresist compositions for exposure with KrF and ArF excimer laser beams.

The component (b) to be comprised in the inventive crosslinked positive-working photoresist composition in combination with the component (a1) described above is an acid-generating agent which is a compound capable of releasing an acid by irradiation with actinic rays. The acid-generating agent is not particularly limitative and any acid-generating compounds can be used for the purpose by selecting from those formulated in conventional chemical-amplification photoresist compositions. It is, however, preferable that the component (b) is an onium salt of a fluoroalkylsulfonic acid ion of which the fluoroalkyl group has 1 to 10 carbon atoms.

Examples of the above-mentioned onium salt compound include trifluoromethane sulfonates of diphenyliodonium, bis(4-tert-butylphenyl)iodonium, triphenylsulfonium and tri(4-methylphenyl)sulfonium as well as nonafluorobutane sulfonates thereof, of which trifluoromethane and nonafluorobutane sulfonates of diphenyliodonium and bis(4-tert-butylphenyl)iodonium are particularly preferable. These acid-generating agents can be used either singly or as a combination of two kinds or more.

The compounding amount of the acid-generating agent as the component (b) in the inventive photoresist composition is in the range from 1 to 10 parts by weight per 100 parts by weight of the component (a1). When the amount thereof is too small, failure of image formation is resulted. When the amount thereof is too large, the photoresist composition can hardly be in the form of a uniform solution or the stability of the solution is decreased due to limited solubility of the acid-generating compound in an organic solvent.

Though optional, the photoresist composition of the present invention can be admixed with an aliphatic tertiary amine compound as the component (c) with an object to accomplish an improvement in the pattern resolution and cross sectional profile of the patterned resist layer as well as in the holding stability of the resist layer which means stability of the latent image formed by exposure against degradation caused by keeping the resist layer after exposure until the post-exposure baking treatment.

Examples of suitable aliphatic tertiary amine compound include trimethylamine, triethylamine, tri-n-propylamine, triisopropylamine, tri-n-butylamine, triisobutylamine, tri-tert-butylamine, tripentylamine, triethanolamine and tributanolamine, of which triethanolamine is preferable. These amine compounds can be used either singly or as a combination of two kinds or more. The compounding amount of these amine compounds, when added, in the inventive photoresist composition is in the range from 0.01 to 1.0 part by weight per 100 parts by weight of the resinous component (a1) in order to accomplish substantial improvements in the performance of the photoresist composition.

While the admixture of an amine compound with the inventive photoresist composition is not free from adverse influences in respect of the photosensitivity of the composition and quality of the patterned resist layer to depend on the nature of the substrate surface, these disadvantages can be decreased by optionally compounding the photoresist composition with an acid compound as the component (d) which can be a carboxylic acid, a phosphorus-containing oxo acid or a derivative thereof.

The above-mentioned carboxylic acid includes saturated and unsaturated aliphatic carboxylic acids, alicyclic carboxylic acids, oxocarboxylic acids, alkoxycarboxylic acids, ketocarboxylic acids and aromatic carboxylic acids. The aromatic carboxylic acid is exemplified by p-hydroxybenzoic acid, o-hydroxybenzoic acid (salicylic acid), 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid and isophthalic acid, of which salicylic acid is particularly preferable.

Examples of the above mentioned phosphorus-containing oxo acids and derivatives thereof include phosphoric acid, di(n-butyl) phosphate, diphenyl phosphate, phosphonic acid, dimethyl phosphonate, di(n-butyl) phosphonate, phenylphosphonic acid, diphenyl phosphonate, dibenzyl phosphonate, phosphinic acid and phenylphosphinic acid as well as esters thereof, of which phenylphosphonic acid is particularly preferable.

The compounding amount of the component (d), when added, is usually in the range from 0.01 to 1.0 part by weight or, preferably, from 0.1 to 0.5 part by weight per 100 parts by weight of the component (a1). When the amount thereof is too small, undesirable cross sectional profile of the patterned resist layer with, for example, trailing skirts and non-orthogonality of the cross section cannot be fully improved while, when the amount thereof is too large, an increase is caused in the film thickness reduction of the patterned resist layer by development.

It is a convenient and advantageous way that the crosslinked positive-working photoresist composition of the present invention is used in the form of a uniform solution prepared by dissolving the above described essential and optional ingredients in an organic solvent. Examples of suitable organic solvents include ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropylene-glycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxy-propionate. These organic solvents can be used either singly or as a mixture of two kinds or more.

It is of course optional according to need that the photoresist composition of the present invention is further compounded with a variety of known additives conventionally formulated in photoresist compositions including auxiliary resins, plasticizers, stabilizers, coloring agents, surface active agents and the like each in a limited amount.

Besides the above described crosslinked photoresist composition comprising the essential components (a1) and (b) as well as optional components (c) and (d) as formulated according to the first aspect of the invention, the invention also provides, according to the second aspect of the invention, a crosslinked photoresist composition of another class comprising the essential components (a2) and (b) and optional components (c) and (d) of which the components (b), (c) and (d) each can be the same one as the components (b), (c) and (d), respectively, in the composition formulated according to the first aspect of the invention so that the above given descriptions relative to these three components are applicable as such to the photoresist composition according to the second aspect of the invention. In other words, the difference between the photoresist compositions according to the first and second aspects of the invention consists solely in the resinous ingredient which is the component (a1) according to the first aspect and component (a2) according to the second aspect of the invention.

Different from the component (a1) in the first-type photoresist composition consisting of the monomeric units or crosslinking units of (a11) to (a14), to say more particularly, the resinous component (a2) in the second-type photoresist composition consists of the monomeric units or crosslinking units of (a21) to (a24), of which the units (a21), (a22) and (a24) can be the same ones as the units (a11), (a12) and (a14), respectively, so that the above given descriptions relative to these three types of the units are applicable as such to the second-type composition. In other words, the difference between the resinous components (a1) and (a2) consists in the monomeric units of the third type which is (a13) represented by the general formula (I) in the former and (a23) represented by the general formula (III) in the latter.

In the general formula (III) representing the monomeric units (a23), R is a hydrogen atom or a methyl group and $R^2_3$ denoting jointly three $R^2$ groups represents a combination of one saturated polycyclic hydrocarbon group and two alkyl groups each having 1 to 4 carbon atoms or a combination of one alkyl group having 1 to 4 carbon atoms as one of the three $R^2$ groups and one polycyclic hydrocarbon group formed jointly from two divalent hydrocarbon groups each as $R^2$ together with the carbon atom adjacent to the ester linkage.

The monomeric unit (a23) is an acid-dissociable solubility-reducing group and, when the photoresist layer is exposed to actinic rays, the tertiary alkyl group is dissociated by being acted by the acid released from the component (b) so that the ester group is converted to a carboxylic group. Thus, the resinous component (a2), which is alkali-insoluble before exposure to light, is rendered alkali-soluble in the light-exposed areas. By virtue of the tertiary alkyl group containing a saturated polycyclic hydrocarbon group in the monomeric units (a23), the resinous component (a2) is advantageous as compared with conventional resins having non-cyclic hydrocarbon groups such as tert-butyl groups in respects of excellent etching resistance, high contrast of patterning, high pattern resolution and large focusing depth latitude.

The rest of the three $R^2$ groups other than the saturated polycyclic hydrocarbon group is or are each an alkyl group having 1 to 5 carbon atoms such as methyl, ethyl, isopropyl, n-propyl, n-butyl, isobutyl and pentyl groups.

The saturated polycyclic hydrocarbon group bonded to the tertiary carbon atom adjacent to the ester linkage is provided either by a single $R^2$ group or jointly by two $R^2$ groups together with the tertiary carbon atom.

The saturated polycyclic hydrocarbon group is not particularly limitative and any one heretofore proposed as a constituent in photoresist compositions for patterning exposure with ArF and KrF excimer laser beams can be used here.

The saturated polycyclic hydrocarbon group is a residue obtained by eliminating a hydrogen atom bonded to any one of the carbon atoms in the ring structure of a molecule of a saturated polycyclic hydrocarbon compound. Examples of the saturated polycyclic hydrocarbon compound include those expressed by the formulas:

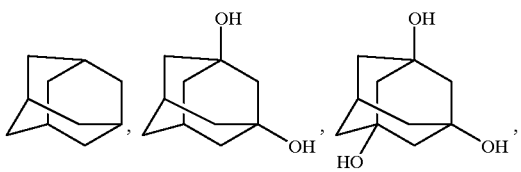

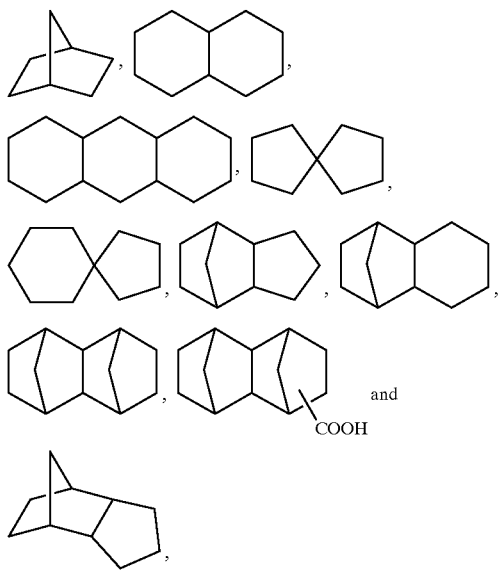

of which the units containing an adamantyl group such as

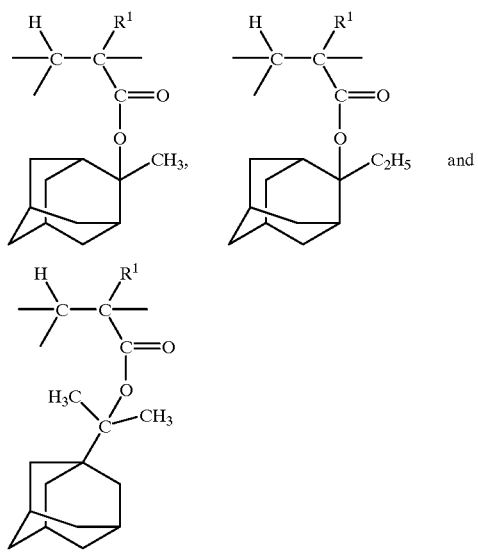

are particularly preferable as the monomeric units (a23) in respect of good availability as well as excellent etching resistance, high contrast and high pattern resolution of the patterned resist layer.

The process for patterning of the photoresist layer formed by using the photoresist composition of the present invention is not particularly different from the process by using conventional photoresist compositions. A typical procedure therefor is as follows. Firstly, a substrate such as a semiconductor silicon wafer, either as such or after formation of an anti-reflection coating film on the surface by using an appropriate anti-reflection coating agent, is uniformly coated with the photoresist solution on a suitable coating machine such as spinners followed by a pre-baking treatment to form a dried photoresist layer. Thereafter, the photoresist layer is patternwise exposed to KrF excimer laser beams through a pattern-bearing photomask as desired on a laser exposure machine to form a patterned latent image in the photoresist layer which is then subjected to a post-exposure baking treatment. The temperature in each of the above mentioned pre-baking treatment and post-exposure baking treatment can be 130° C. or higher or, preferably, 140° C. or higher to be somewhat higher than in conventional patterning processes because the acid-dissociable solubility-reducing groups in the resinous ingredient of the inventive photoresist composition, which are 1-alkylcyclohexyl groups or polycyclic saturated hydrocarbon groups, are less susceptible to acid-induced dissociation than acetal groups and tert-butoxycarbonyloxy groups contained in conventional photoresist compositions. Nextly, the photoresist layer bearing the latent image of the pattern is subjected to a development treatment with an aqueous alkaline developer solution such as a 0.1–10% aqueous solution of tetramethylammonium hydroxide to give a positively patterned resist layer with high fidelity to the photomask pattern. The inventive positive-working photoresist composition exhibits quite satisfactory performance also in patterning exposure with electron beams.

In the following, the photoresist composition of the present invention is described in more detail by way of Examples, in which the term of "parts" always refers to "parts by weight".

EXAMPLE 1

A positive-working photoresist composition in the form of a uniform solution was prepared by dissolving, in 500 parts of ethyl lactate as the solvent, (1) 100 parts of a copolymeric resin, (2) 3 parts of diphenyliodonium trifluoromethane sulfonate, (3) 0.16 part of triethanolamine and (4) 0.16 part of phenylphosphonic acid to give a solution which was further admixed with 0.1 part of a fluorosilicone-based surface active agent (R-08, a product by Dai-Nippon Ink Co.) followed by filtration of the solution through a membrane filter of 0.2 $\mu$m pore diameter.

The copolymeric resin (1) used here consisted of 63.0% by moles of hydroxystyrene units, 10.5% by moles of styrene units, 23.0% by moles of 1-ethylcyclohexyl acrylate units and 3.5% by moles of 2,5-dimethyl-2,5-hexanediol diacrylate units and had a weight-average molecular weight of 25000. The rate of film thickness reduction of a film of this copolymeric resin in a 2.38% aqueous solution of tetramethylammonium hydroxide was 8.0 nm/second at 23° C.

A silicon wafer having an antireflection coating film of 60 nm thickness formed by using an antireflection coating agent (AR 3, a product by Shipley Co.) was uniformly coated with the above prepared positive-working photoresist solution on a spinner followed by a pre-baking treatment on a hot plate at 140° C. for 90 seconds to form a photoresist layer of 0.45 $\mu$m thickness.

The photoresist layer was pattern-wise exposed to KrF excimer laser beams through a halftone photomask on a minifying projection exposure machine (Model NSRS-203B, manufactured by Nikon Co., NA=0.68) and then subjected to a post-exposure baking treatment at 140° C. for 90 seconds. Thereafter, the photoresist layer was subjected to a puddle development treatment at 23° C. for 60 seconds with a 2.38% aqueous solution of tetramethylammonium hydroxide and finally to a post-baking treatment at 100° C. for 60 second to give a positively patterned resist layer.

In this way, a quite satisfactory hole pattern of 0.13 $\mu$m diameter could be obtained with a focusing depth latitude of 0.5 $\mu$m. This patterned resist layer exhibited a rate of film thickness reduction of 7.5 nm/second when subjected to an etching test by using a gaseous mixture of carbon tetrafluoride, trifluoromethane and helium as the etching gas.

EXAMPLE 2

The experimental procedure was substantially the same as in Example 1 excepting for the replacement of the resinous ingredient in the photoresist composition with the same amount of another copolymeric resin which consisted of 70.0% by moles of hydroxystyrene units, 15.0% by moles of styrene units, 10.0% by moles of 1-ethylcyclohexyl acrylate units and 5.0% by moles of 2,5-dimethyl-2,5-dihydroxy-3-(2-hydroxypropyl)hexane triacrylate and had a weight-average molecular weight of 25000. A film of this resin exhibited a rate of film thickness reduction of 10 nm/second at 23° C. in a 2.38% aqueous solution of tetramethylammonium hydroxide.

By conducting patterning of the photoresist layer in the same manner as in Example 1, a quite satisfactory hole pattern of 0.13 $\mu$m diameter could be obtained with a focusing depth latitude of 0.4 $\mu$m. The rate of film thickness reduction by etching was 7.0 nm/second as determined in the same manner as in Example 1.

EXAMPLE 3

The experimental procedure was substantially the same as in Example 1 excepting for the replacement of 3 parts of the diphenyliodonium trifluoromethane sulfonate with 4.5 parts of diphenyliodonium nonafluorobutane sulfonate.

By conducting patterning of the photoresist layer in the same manner as in Example 1, a quite satisfactory hole pattern of 0.13 $\mu$m diameter could be obtained with a focusing depth latitude of 0.4 $\mu$m. The rate of film thickness reduction by etching was 7.5 nm/second as determined in the same manner as in Example 1.

COMPARATIVE EXAMPLE 1

The experimental procedure was substantially the same as in Example 1 excepting for the replacement of the resinous ingredient with the same amount of another copolymeric resin which consisted of 65.0% by moles of hydroxystyrene units, 20.0% by moles of styrene units and 15.0% by moles of 1-ethyl-cyclohexyl acrylate units and had a weight-average molecular weight of 12000. A film of this resin exhibited a rate of film thickness reduction of 8 nm/second at 23° C. in a 2.38% aqueous solution of tetramethylammonium hydroxide.

By conducting patterning of the photoresist layer in the same manner as in Example 1, a hole pattern of 0.16 $\mu$m diameter was obtained, which, however, had a slightly trapezoidal cross sectional profile, with a focusing depth latitude of 0.4 $\mu$m. The rate of film thickness reduction of the patterned resist layer in etching was 8.0 nm/second as determined in the same manner as in Example 1.

COMPARATIVE EXAMPLE 2

The experimental procedure was substantially the same as in Example 1 excepting for the replacement of the resinous ingredient with the same amount of another copolymeric resin which consisted of 70.0% by moles of hydroxystyrene units, 15.0% by moles of styrene units, 10.0% by moles of tert-butyl acrylate units and 5.0% by moles of 2,5-dimethyl-2,5-hexanediol diacrylate units and had a weight-average molecular weight of 25000. A film of this resin exhibited a rate of film thickness reduction of 8 nm/second at 23° C. in a 2.38% aqueous solution of tetramethylammonium hydroxide.

By conducting patterning of the photoresist layer in the same manner as in Example 1, a satisfactory hole pattern of 0.15 μm diameter was obtained with a focusing depth latitude of 0.4 μm. The rate of film thickness reduction of the patterned resist layer in etching was 12.0 nm/second as determined in the same manner as in Example 1.

EXAMPLE 4

The experimental procedure was substantially the same as in Example 1 excepting for the replacement of the resinous ingredient with the same amount of another copolymeric resin which consisted of 66.5% by moles of hydroxystyrene units, 15.0% by moles of styrene units, 15.0% by moles of 2-methyladamantyl methacrylate units and 3.5% by moles of 2,5-dimethyl-2,5-hexanediol diacrylate and had a weight-average molecular weight of 25000. A film of this resin exhibited a rate of film thickness reduction of 6 nm/second at 23° C. in a 2.38% aqueous solution of tetramethylammonium hydroxide.

By conducting patterning of the photoresist layer in the same manner as in Example 1, a quite satisfactory hole pattern of 0.15 μm diameter could be obtained with a focusing depth latitude of 0.5 μm. The rate of film thickness reduction by etching was 5.5 nm/second as determined in the same manner as in Example 1.

EXAMPLE 5

The experimental procedure was substantially the same as in Example 1 excepting for the replacement of the resinous ingredient with the same amount of another copolymeric resin which consisted of 65.0% by moles of hydroxystyrene units, 15.0% by moles of styrene units, 15.0% by moles of isoadamantyl methacrylate units and 5.0% by moles of 2,5-dimethyl-2,5-dihydroxy-3-(2-hydroxypropyl)hexane triacrylate units and had a weight-average molecular weight of 25000. A film of this resin exhibited a rate of film thickness reduction of 8 nm/second at 23° C. in a 2.38% aqueous solution of tetramethylammonium hydroxide.

By conducting patterning of the photoresist layer in the same manner as in Example 1, a quite satisfactory hole pattern of 0.15 μm diameter could be obtained with a focusing depth latitude of 0.5 μm. The rate of film thickness reduction by etching was 6.0 nm/second as determined in the same manner as in Example 1.

EXAMPLE 6

The experimental procedure was substantially the same as in Example 4 excepting for the replacement of 3 parts of the diphenyliodonium trifluoromethane sulfonate with 4.5 parts of diphenyliodonium nonafluorobutane sulfonate.

By conducting patterning of the photoresist layer in the same manner as in Example 1, a quite satisfactory hole pattern of 0.15 μm diameter could be obtained with a focusing depth latitude of 0.4 μm. The rate of film thickness reduction by etching was 5.5 nm/second as determined in the same manner as in Example 1.

COMPARATIVE EXAMPLE 3

The experimental procedure was substantially the same as in Example 1 excepting for the replacement of the resinous ingredient with the same amount of another copolymeric resin which consisted of 65.0% by moles of hydroxystyrene units, 20.0% by moles of styrene units and 15.0% by moles of 2-methyl-adamantyl methacrylate units and had a weight-average molecular weight of 12000. A film of this resin exhibited a rate of film thickness reduction of 8 nm/second at 23° C. in a 2.38% aqueous solution of tetramethylammonium hydroxide.

By conducting patterning of the photoresist layer in the same manner as in Example 1, a hole pattern of 0.16 μm diameter was obtained with a focusing depth latitude of 0.3 μm. The rate of film thickness reduction of the patterned resist layer in etching was 6.0 nm/second as determined in the same manner as in Example 1.

What is claimed is:

1. A crosslinked positive-working photoresist composition which comprises, in the form of a uniform solution in an organic solvent:

(a1) a polymeric resin which is subject to an increase of solubility in an aqueous alkaline solution in the presence of an acid; and (b) a radiation-sensitive acid-generating agent capable of releasing an acid when irradiated with a radiation, in which the polymeric resin as the component (a1) is a quaternary copolymer consisting of four kinds of monomeric units including (a11) monomeric units of the first type represented by the general formula

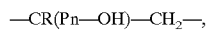
—CR(Pn—OH)—CH$_2$—, in which R is a hydrogen atom or a methyl group and Pn is a phenylene group, (a12) monomeric units of the second type represented by the general formula

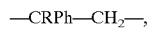
—CRPh—CH$_2$—, in which R is a hydrogen atom or a methyl group and Ph is a phenyl group, (a13) monomeric units of the third type represented by the general formula

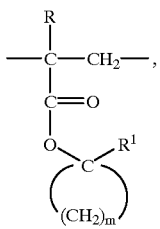

in which R is a hydrogen atom or a methyl group, R$^1$ is an alkyl group having 1 to 4 carbon atoms and the subscript m is a positive integer of 3 to 7, and (a14) monomeric units of the fourth type represented by the general formula

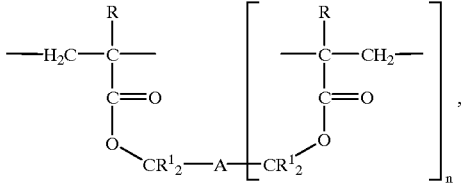

in which R is a hydrogen atom or a methyl group, each R$^1$ is, independently from the others, an alkyl group having 1 to 4 carbon atoms, the subscript n is 1, 2 or 3 and A is a single bond or an organic group of (n+1) valency.

2. The crosslinked positive-working photoresist composition as claimed in claim 1 in which the molar fractions of the monomeric units (a11), (a12), (a13) and (a14) in the polymeric resin as the component (a1) are from 50 to 80%, from 1 to 25%, from 3 to 25% and from 1 to 15%, respectively.

3. The crosslinked positive-working photoresist composition as claimed in claim 1 in which, in the general formula representing the monomeric units (a14), the subscript n is 1 and A is an alkylene group having 1 to 20 carbon atoms.

4. The crosslinked positive-working photoresist composition as claimed in claim 1 which further comprises: (c) from 0.01 to 1.0 part by weight of an aliphatic tertiary amine compound per 100 parts by weight of the polymeric resin as the component (a1).

5. The crosslinked positive-working photoresist composition as claimed in claim 1 which further comprises: (d) from 0.01 to 1.0 part by weight of a carboxylic acid compound or a phosphorus-containing oxo acid compound or an ester compound thereof per 100 parts by weight of the polymeric resin as the component (a1).

6. The crosslinked positive-working photoresist composition as claimed in claim 2 in which the molar fractions of the monomeric units (a11), (a12), (a13) and (a14) in the polymeric resin as the component (a1) are from 65 to 80%, from 5 to 20%, from 5 to 20% and from 3 to 10%, respectively.

7. The crosslinked positive-working photoresist composition as claimed in claim 1 in which a film of the polymeric resin as the component (a1) exhibits reduction of film thickness in a 2.38% by weight aqueous solution of tetramethylammonium hydroxide at 23° C. at a rate in the range from 5 to 500 nm/second.

8. A crosslinked positive-working photoresist composition which comprises, in the form of a uniform solution in an organic solvent:

(a2) a polymeric resin which is subject to an increase of solubility in an aqueous alkaline solution in the presence of an acid; and (b) a radiation-sensitive acid-generating agent capable of releasing an acid when irradiated with a radiation, in which the polymeric resin as the component (a2) is a quaternary copolymer consisting of four kinds of monomeric units including (a21) monomeric units of the first type represented by the general formula —CR(Pn—OH)—CH$_2$—, in which R is a hydrogen atom or a methyl group and Pn is a phenylene group, (a22) monomeric units of the second type represented by the general formula —CRPh—CH$_2$—, in which R is a hydrogen atom or a methyl group and Ph is a phenyl group, (a23) monomeric units of the third type represented by the general formula

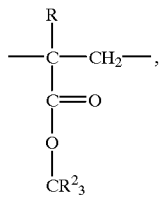

in which R is a hydrogen atom or a methyl group, $R^2_3$ denoting jointly three $R^2$ groups represents a combination of one saturated polycyclic hydrocarbon group and two alkyl groups each having 1 to 4 carbon atoms or a combination of an alkyl group having 1 to 4 carbon atoms as one of the three $R^2$ groups and a saturated polycyclic hydrocarbon group formed jointly from two divalent hydrocarbon groups as the rest of the three $R^2$ groups together with the carbon atom adjacent to the ester linkage, and (a24) monomeric units of the fourth type represented by the general formula

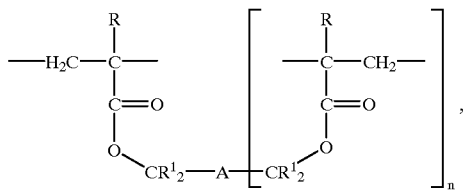

in which R is a hydrogen atom or a methyl group, each $R^1$ is, independently from the others, an alkyl group having 1 to 4 carbon atoms, the subscript n is 1, 2 or 3 and A is a single bond or an organic group of (n+1) valency.

9. The crosslinked positive-working photoresist composition as claimed in claim 8 in which the molar fractions of the monomeric units (a21), (a22), (a23) and (a24) in the polymeric resin as the component (a2) are from 50 to 80%, from 1 to 25%, from 3 to 25% and from 1 to 15%, respectively.

10. The crosslinked positive-working photoresist composition as claimed in claim 8 in which, in the general formula representing the monomeric units (a24), the subscript n is 1 and A is an alkylene group having 1 to 20 carbon atoms.

11. The crosslinked positive-working photoresist composition as claimed in claim 8 which further comprises: (c) from 0.01 to 1.0 part by weight of an aliphatic tertiary amine compound per 100 parts by weight of the polymeric resin as the component (a2).

12. The crosslinked positive-working photoresist composition as claimed in claim 8 which further comprises: (d) from 0.01 to 1.0 part by weight of a carboxylic acid compound or a phosphorus-containing oxo acid compound or an ester compound thereof per 100 parts by weight of the polymeric resin as the component (a2).

13. The crosslinked positive-working photoresist composition as claimed in claim 9 in which the molar fractions of the monomeric units (a21), (a22), (a23) and (a24) in the polymeric resin as the component (a2) are from 65 to 80%, from 5 to 20%, from 5 to 20% and from 3 to 10%, respectively.

14. The crosslinked positive-working photoresist composition as claimed in claim 8 in which a film of the polymeric resin as the component (a2) exhibits reduction of film thickness in a 2.38% by weight aqueous solution of tetramethylammonium hydroxide at 23° C. at a rate in the range from 5 to 500 nm/second.

* * * * *